United States Patent
Lee

(10) Patent No.: US 10,559,782 B2
(45) Date of Patent: Feb. 11, 2020

(54) METHOD OF MANUFACTURING ORGANIC LIGHT EMITTING DISPLAY APPARATUS

(71) Applicant: SAMSUNG DISPLAY CO., LTD., Yongin-si, Gyeonggi-do (KR)

(72) Inventor: Soyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/145,288

(22) Filed: Sep. 28, 2018

(65) Prior Publication Data

US 2019/0036084 A1 Jan. 31, 2019

Related U.S. Application Data

(62) Division of application No. 14/682,742, filed on Apr. 9, 2015, now abandoned.

(30) Foreign Application Priority Data

Sep. 5, 2014 (KR) .......................... 10-2014-0119383

(51) Int. Cl.
*H01L 51/52* (2006.01)
*H01L 27/32* (2006.01)

(52) U.S. Cl.
CPC ...... *H01L 51/5268* (2013.01); *H01L 27/3246* (2013.01); *H01L 51/524* (2013.01); *H01L 51/525* (2013.01); *H01L 51/5284* (2013.01); *H01L 51/5259* (2013.01)

(58) Field of Classification Search
CPC .................................................. H01L 27/3244
See application file for complete search history.

(56) References Cited

U.S. PATENT DOCUMENTS 7,060,637 B2 6/2006 Li et al.
8,093,603 B2 * 1/2012 Jung ................... H01L 27/3246
257/57

(Continued)

FOREIGN PATENT DOCUMENTS

JP 2001-093665 A 4/2001
JP 2007-206352 A 8/2007

(Continued)

*Primary Examiner* — Yu-Hsi D Sun
(74) *Attorney, Agent, or Firm* — Lewis Roca Rothgerber Christie LLP

(57) ABSTRACT

An organic light emitting display apparatus and a method of manufacturing an organic light emitting display apparatus, the apparatus including a first substrate; an organic light emitting diode on the first substrate, the organic light emitting diode including an emitting area that generates light, and a non-emitting area which generates no light; a second substrate facing the organic light emitting diode; a black matrix layer on a surface of the second substrate that faces the organic light emitting diode, the black matrix layer including an open area aligned with the emitting area of the organic light emitting diode, and a closed area aligned with the non-emitting area of the organic light emitting diode; and a photoresist member, at least a portion of the photoresist member being on the open area of the black matrix layer and protruding toward the organic light emitting diode.

10 Claims, 12 Drawing Sheets

(56) References Cited

U.S. PATENT DOCUMENTS

| | | | |
|---|---|---|---|
| 8,247,826 B2 * | 8/2012 | Jeon | .................. H01L 51/5246 |
| | | | 257/88 |
| 8,563,358 B2 | 10/2013 | Landesberger et al. | |
| 2005/0142977 A1 | 6/2005 | Park | |
| 2008/0138657 A1 | 6/2008 | Lee et al. | |
| 2008/0297032 A1 | 12/2008 | Kim et al. | |
| 2014/0043551 A1 | 2/2014 | Kunimatsu et al. | |

FOREIGN PATENT DOCUMENTS

| | | |
|---|---|---|
| JP | 2013-127639 A | 6/2013 |
| KR | 2005-0067680 A | 7/2005 |
| KR | 10-0829750 B1 | 5/2008 |
| KR | 10-0858823 B1 | 9/2008 |
| KR | 2009-0065104 A | 6/2009 |

* cited by examiner

METHOD OF MANUFACTURING ORGANIC LIGHT EMITTING DISPLAY APPARATUS

CROSS-REFERENCE TO RELATED APPLICATIONS

This is a divisional application based on pending application Ser. No. 14/682,742, filed Apr. 9, 2015, the entire contents of which is hereby incorporated by reference.

Korean Patent Application No. 10-2014-0119383, filed on Sep. 5, 2014, in the Korean Intellectual Property Office, and entitled: "Organic Light Emitting Display Apparatus and Method of Manufacturing the Same," is incorporated by reference herein in its entirety.

BACKGROUND

1. Field

Embodiments relate to an organic light emitting display apparatus and a method of manufacturing the same.

2. Description of the Related Art

Organic light-emitting display apparatuses may include a hole injection electrode, an electron injection electrode, and an emission layer formed between the hole injection electrode and the electron injection electrode. Organic light-emitting display apparatuses are self-emitting display apparatuses that emit light as a hole injected from the hole injection electrode and an electron injected from the electron injection electrode recombine in the emission layer. Organic light-emitting display apparatuses are being noted as next-generation display apparatuses due to characteristics such as low power consumption, high brightness, and a fast response time.

SUMMARY

Embodiments are directed to an organic light emitting display apparatus and a method of manufacturing the same.

The embodiments may be realized by providing an organic light emitting display apparatus including a first substrate; an organic light emitting diode on the first substrate, the organic light emitting diode including an emitting area that generates light, and a non-emitting area which generates no light; a second substrate facing the organic light emitting diode; a black matrix layer on a surface of the second substrate that faces the organic light emitting diode, the black matrix layer including an open area aligned with the emitting area of the organic light emitting diode, and a closed area aligned with the non-emitting area of the organic light emitting diode; and a photoresist member, at least a portion of the photoresist member being on the open area of the black matrix layer and protruding toward the organic light emitting diode.

The organic light emitting diode may include an emission layer in the emitting area, and the organic light emitting diode may include a pixel defining layer in the non-emitting area and at an edge of the emission layer.

The pixel defining layer and the emission layer may form a groove in the organic light emitting diode.

A distance between the second substrate and the pixel defining layer may be less than a distance between the second substrate and the emission layer.

At least a portion of the photoresist member may be in the groove of the organic light emitting diode.

The photoresist member may be prepared from a negative photosensitive material.

The closed area of the black matrix layer may have a light shading rate equal to or greater than about 40%.

The photoresist member may include a first photoresist area on the closed area, and a second photoresist area on the open area, a distance between the first substrate and the second photoresist layer being less than a distance between the first substrate and the first photoresist area.

A material of the first photoresist area and that of the second photoresist area may be identical.

The first photoresist area and the second photoresist area may be prepared from negative photosensitive materials.

A material of the first photoresist area and that of the second photoresist area may be different from each other.

The first photoresist area may be prepared from a positive photosensitive material, and the second photoresist area may be prepared from a negative photosensitive material.

The photoresist member may further include at least one of an absorbent, a light scattering particle, or a light blocking material.

The embodiments may be realized by providing a method of manufacturing an organic light emitting display apparatus, the method including forming a black matrix layer on one surface of a second substrate such that the black matrix layer includes an open area and a closed area; forming a photosensitive photoresist layer in the open area and the closed area of the black matrix layer; light exposing and developing the photosensitive photoresist layer such that a photoresist member remains in the open area of the black matrix layer; providing a first substrate that has an emission layer and a pixel defining layer thereon; disposing the second substrate on the first substrate such that the second substrate faces the first substrate; and aligning the second substrate with the first substrate such that the open area of the black matrix layer is aligned with the emission layer, by inserting at least a portion of the photoresist member in a groove formed by the emission layer and the pixel defining layer.

The photosensitive photoresist layer may include a negative photosensitive material.

The closed area of the black matrix layer may have a light shading rate equal to or greater than about 40%.

The photoresist member may include a first photoresist area on the closed area, and a second photoresist area on the open area, the second photoresist member being thicker than the first photoresist area.

The method may further include forming a second photosensitive photoresist layer that includes a positive photosensitive material, and light exposing and developing the second photosensitive photoresist layer such that a second photoresist member remains on the closed area of the black matrix layer, wherein the second photosensitive photoresist layer is formed and the light exposing and developing is performed prior to forming the photoresist member.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
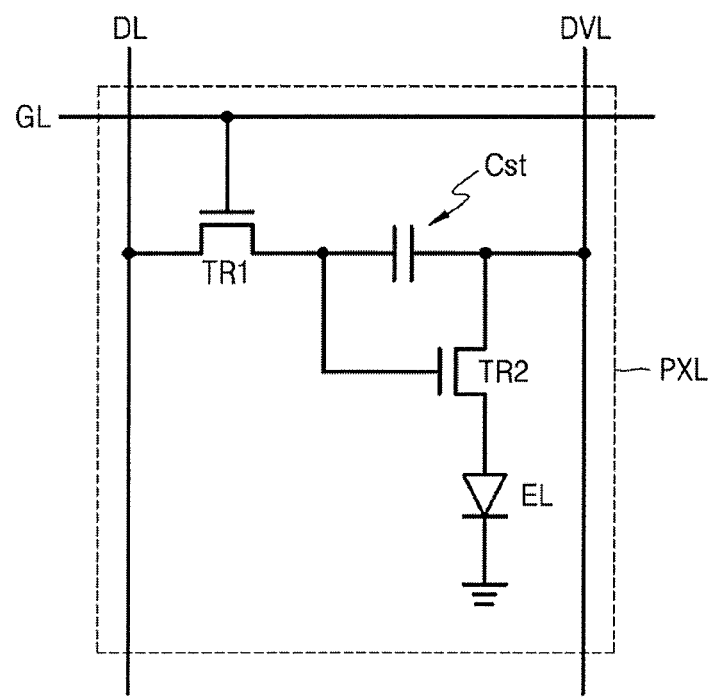
FIG. 1 illustrates a circuit diagram of an organic light emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

While such terms as "first" and "second" may be used to describe various components, such components must not be limited to the above terms. The above terms are used only to distinguish one component from another.

As used herein, the singular forms "a," "an," and "the" are intended to include the plural forms as well, unless the context clearly indicates otherwise.

It will be further understood that the terms such as "including," "comprising," and "having" used herein specify the presence of stated features or components, but do not preclude the presence or addition of one or more other features or components.

It will be understood that when a layer, region, or component is referred to as being "on" or "formed on" another layer, region, or component, it can be directly or indirectly on or formed on the other layer, region, or component. For example, intervening layers, regions, or components may be present.

As noted above, sizes of components in the drawings may be exaggerated for convenience of explanation. In other words, since sizes and thicknesses of components in the drawings are arbitrarily illustrated for convenience of explanation, the following embodiments are not limited thereto.

Expressions such as "at least one of," when preceding a list of elements, modify the entire list of elements and do not modify the individual elements of the list.

Figure 2:
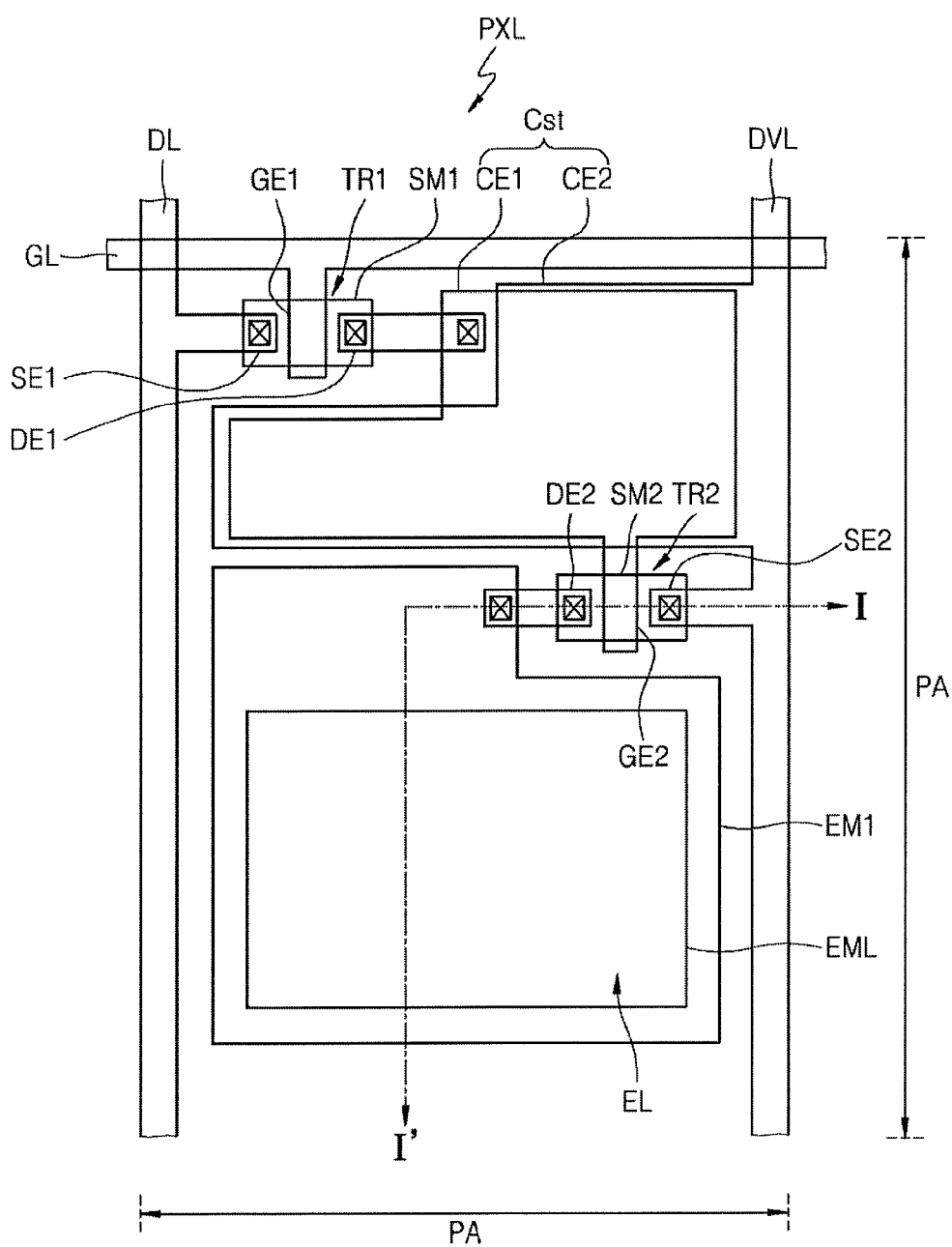
FIG. 2 illustrates a plan view of a pixel of FIG. 1.
Figure 3:
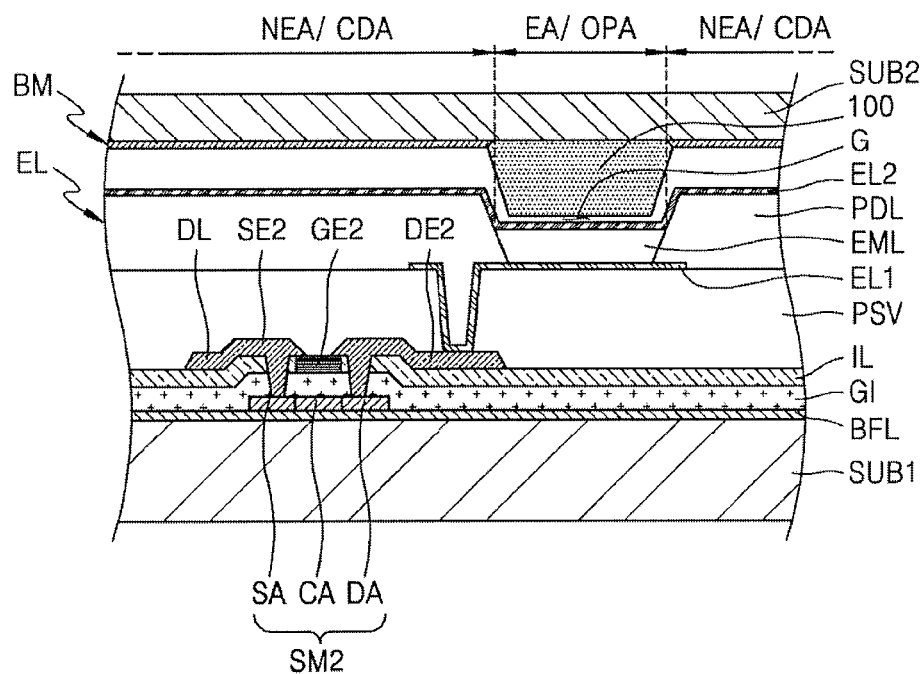
FIG. 3 illustrates a cross-sectional view taken along a line I-I' of FIG. 2.

FIG. 1 illustrates a circuit diagram of an organic light emitting display apparatus according to an embodiment, FIG. 2 illustrates a plan view of a pixel PXL of FIG. 1, and FIG. 3 illustrates a cross-sectional view taken along a line I-I' of FIG. 2. Hereinafter, the organic light emitting display apparatus according to the present embodiment will be described with reference to FIGS. 1 through 3.

The organic light emitting display apparatus according to the present embodiment may include at least one pixel PXL.

The pixel PXL may be provided in a pixel area PA. While the pixel PXL may be provided in plurality and arranged in a matrix form, only one PXL is illustrated in the present embodiment for convenience of explanation. While each of the pixels PXLs is shown as being rectangular, the shape of the pixel PXL is not limited thereto and may vary. In an implementation, the areas of each of the pixels PXLs may be different from each other.

The pixel PXL may include a wiring portion including a gate line GL, a data line DL and a driving voltage line DVL, a thin film transistor connected to the wiring portion, an organic light emitting diode EL connected to the thin film transistor and a capacitor Cst.

The gate line GL may extend in one direction. The data line DL may extend in another direction, crossing the gate line GL. The driving voltage line DVL may extend in substantially the same direction as the data line DL. The gate line GL may deliver a scanning signal to the thin film transistor, the data line DL may deliver a data signal to the thin film transistor, and the driving voltage line DVL may provide a driving voltage to the thin film transistor.

The thin film transistor may include a driving thin film transistor TR2 for controlling the organic light emitting diode EL and a switching thin film transistor TR1 for switching the driving thin film transistor TR2. While the present embodiment describes that one pixel PXL includes the two transistors TR1 and TR2, the present embodiment is not limited thereto. For example, one pixel PXL may include one thin film transistor and one capacitor, or three thin film transistors or more and two capacitors or more.

The switching thin film transistor TR1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a gate electrode of the driving thin film transistor TR2 (e.g., a second gate electrode GE2). According to a scanning signal applied to the gate line GL, the switching thin film transistor TR1 may deliver a data signal applied to the data line DL to the driving thin film transistor TR2.

The driving thin film transistor TR2 may include a second gate electrode GE2, a second source electrode SE2, and a second drain electrode DE2. The second gate electrode GE2 may be connected to the switching thin film transistor TR1, the second source electrode SE2 may be connected to the driving voltage line DVL, and the second drain electrode DE2 may be connected to the organic light emitting diode EL.

The organic light emitting diode EL may include a first electrode EL1 and a second electrode EL2 that face each other, and an emission layer EML disposed therebetween. The first electrode EL1 may be connected to the second drain electrode DE2 of the driving thin film transistor TR2. A common voltage may be applied to the second electrode EL2, and the emission layer EMI, may display a picture by emitting light according to an output signal of the driving thin film transistor TR2.

The capacitor Cst may be connected between the second gate electrode GE2 and the second source electrode SE2 of the driving thin film transistor TR2 and may charge and maintains a data signal which is input to the second gate electrode GE2 of the driving thin film transistor TR2.

Hereinafter, the organic light emitting display apparatus according to the present embodiment will be described according to a stacking sequence to form the same.

In an implementation, a first substrate SUB1 may be, e.g., a glass substrate or a plastic substrate including polyethylen terephthalate (PET), polyethylen naphthalate (PEN), and/or polyimide.

A buffer layer BFL may be formed on the first substrate SUB1. The buffer layer BFL may help prevent impurities from spreading in the switching and driving thin film transistors TR1 and TR2. The buffer layer BFL may be formed of, e.g., SiNx, SiOx, SiOxNy, or the like, or may be omitted according to a material and a process condition of the first substrate SUB1.

A first semiconductor layer SM1 and a second semiconductor layer SM2 may be provided on the buffer layer BFL. The first semiconductor layer SM1 and the second semiconductor layer SM2 may be formed of semiconductor materials and function as active layers of the switching thin film transistor TR1 and the driving thin film transistor TR2, respectively. Each of the first semiconductor layer SM1 and the second semiconductor layer SM2 may include a source area SA, a drain area DA, and a channel area CA between the source area SA and the drain area DA. The first semiconductor layer SM1 and the second semiconductor layer SM2 may each be formed of an inorganic semiconductor or an organic semiconductor. For example, the first semiconductor layer SM1 and the second semiconductor layer SM2 may include an oxide semiconductor, amorphous silicon semiconductor and crystalline, or polycrystalline silicon semiconductor. The oxide semiconductor may be formed of an oxide including at least one of indium (In), gallium (Ga), zinc (Zn), and tin (Sn). For example, the first and the second semiconductor layers SM1 and SM2 may include an oxide semiconductor such as Zn oxide, Sn oxide, indium oxide, In—Zn oxide, In—Sn oxide, In—Ga—Zn oxide, In—Zn—Sn oxide, and In—Ga—Zn—Sn oxide. The source area SA and the drain area DA may be doped with n-type impurities or p-type impurities.

A gate insulating layer GI may be provided on the first semiconductor layer SM1 and the second semiconductor layer SM2.

The first gate electrode GE1 connected to the gate line GL and the second gate electrode GE2 may be provided on the gate insulating layer GI. The first gate electrode GE1 and the second gate electrode GE2 may cover areas corresponding to the channel areas CAs of the first semiconductor layer SM1 and the second semiconductor layer SM2, respectively.

An interlayer insulating layer IL may be provided on the first and second gate electrodes GE1 and GE2 to cover the first and second gate electrodes GE1 and GE2. The first source electrode SE1 and the first drain electrode DE1, and the second source electrode SE2 and the second drain electrode DE2 may be provided on the interlayer insulating layer IL. The first source electrode SE1 and the first drain electrode DE1 may contact the source area SA and the drain area DA of the first semiconductor layer SM1, respectively, through contact holes formed in the gate insulating layer GI and the interlayer insulating layer IL. The second source electrode SE2 and the second drain electrode DE2 may contact the source area SA and the drain area DA of the second semiconductor layer SM2, respectively, through contact holes formed in the gate insulating layer GI and the interlayer insulating layer IL.

Meanwhile, a portion of the second gate electrode GE2 and a portion of the driving voltage line DVL may correspond to a first capacitor electrode CE1 and a second capacitor electrode CE2, respectively, and may form the capacitor Cst while having the interlayer insulating layer IL disposed therebetween.

A passivation layer PSV may be provided on the first source electrode SE1 and the first drain electrode DE1, the second source electrode SE2 and the second drain electrode DE2, and the interlayer insulating layer IL. The passivation layer PSV may include an inorganic insulating material such as silicon nitride or silicon oxide.

The passivation layer PSV may serve not only as a shielding layer for protecting the switching and driving thin film transistors TR1 and TR2 but also as a planarization layer for planarizing upper surfaces of the switching and driving thin film transistors TR1 and TR2.

The organic light emitting diode EL may be provided on the passivation layer PSV. The organic light emitting diode EL may include the first electrode EL1, the emission layer EML, the second electrode EL2, and a pixel defining layer PDL. The organic light emitting diode EL may have an emitting area EA (that generates light) and a non-emitting area NEA (that generates no light). Thus, the organic light emitting diode EL may display an image. The emitting area EA may include the emission layer EML and the non-emitting area NEA may include the pixel defining layer PDL.

The first electrode EL1 may be connected to the second drain electrode DE2 of the driving thin film transistor TR2 through a contact hole formed in the passivation layer PSV. Here, while the first electrode EL1 may be used as a cathode, a case where the first electrode EL1 is used as an anode will be described as an example hereinafter.

The first electrode EL1 may be formed of a material having a high work function. In a case that an image is provided to a lower direction of the first substrate SUB1, the first electrode EL1 may be formed in a transparent conductive layer such as indium tin oxide (ITO), indium zinc oxide (IZO), zinc oxide (ZnO), or indium tin zinc oxide (ITZO).

The pixel defining layer PDL may be provided on the first substrate SUB1 where the first electrode EL1 and the like are formed and may partition the emitting area EA such that portions of the emitting area EA correspond to each of the pixels PXLs. The pixel defining layer PDL may expose an upper surface of the first electrode EL1 and may protrude away from the first substrate SUB1 along an edge of the emitting area EA.

The pixel defining layer PDL may include an insulating material. The pixel defining layer PDL may include, e.g., acrylic, benzocyclobutene, and/or polyimide (PI).

The emission layer EML may be provided in the emitting area EA (surrounded by the pixel defining layer PDL), and the second electrode EL2 may be provided on the emission layer EML. The pixel defining layer PDL may be disposed around the emission layer EML. The pixel defining layer PDL may protrude toward a second substrate SUB2 more than the emission layer EML. For example, the pixel defining layer PDL may protrude closer to the second substrate SUB2 that the emission layer EML protrudes to or toward the second substrate SUB2. Thus, a groove G may be formed (or defined) in the organic light emitting diode EL by the pixel defining layer PDL and the emission layer EML. A portion of the second electrode EL2 may be disposed in the groove G.

In an implementation, the emission layer EML may emit white light. The emission layer EML may be formed of various luminescent materials including a host and a dopant. As the dopant, e.g., a fluorescent dopant and/or a phosphorescent dopant may both be used. As the host, e.g., Alq3C CBP (4,4'-N,N'-dicarbazole-biphenyl), 9,10-di (naphthalen-2-yl) anthracen (ADN), or DSA (distyrylarylene) may be used.

The second electrode EL2 may include a material having a low work function, e.g., a metal, an alloy, an electrically conductive compound, or a mixture thereof. In an implementation, the second electrode EL2 may include, e.g., lithium (Li), magnesium (Mg), aluminum (Al), aluminum-lithium (Al—Li), calcium (Ca), magnesium-indium (Mg—In), and/or magnesium-silver (Mg—Ag).

In an implementation, a hole injection layer (HIL) and a hole transport layer (HTL) may be provided between the first electrode EU and the emission layer EML, and an electron injection layer (EIL) and an electron transport layer (ETL) may be provided between the emission layer EML and the second electrode EL2. When the first electrode EL1 serves as the anode, the HIL, the HTL, the emission layer EML, the ETL, the EIL, and the second electrode EL2 may be sequentially stacked on the first electrode EU to form the lower common layer, the upper common layer and the emission layer EML.

The second substrate SUB2 may be disposed to face the organic light emitting diode EL. The second substrate SUB2 may protect the organic light emitting diode EL and other thin films from external moisture or oxygen.

When the organic light emitting display apparatus is of a top-emitting structure, the second substrate SUB2 may be a transparent member which transmits light. For example, the second substrate SUB2 may be a glass substrate. However, a material of the second substrate SUB2 is not limited thereto, and various materials may be used for the second substrate SUB2. For example, the second substrate SUB2 may be a polymer substrate or a flexible film. In an implementation, the second substrate SUB2 may have a structure in which an organic film and an inorganic film are alternately stacked.

A black matrix layer BM may be formed on a surface of the second substrate SUB2 that faces the organic light emitting diode EL. The black matrix layer BM may have an open area OPA and a closed area CDA.

The open area OPA may correspond to, overlie, or be aligned with the emitting area EA of the organic light emitting diode E. The closed area CDA may correspond to, overlie, or be aligned with the non-emitting area NEA of the organic light emitting diode EL. For example, the open area OPA may correspond to, overlie, or be aligned with the emission layer EML and the closed area CDA may correspond to, overlie, or be aligned with the pixel defining layer PDL.

The black matrix layer BM may transmit light generated in the emission layer EML through the opening area OPA, and the black matrix layer BM may absorb light coming in from the outside at the closed area CDA, thereby improving contrast and luminous efficiency of the organic light emitting display apparatus.

The black matrix layer BM may be spaced apart from the emission layer EML. Accordingly, an effect that a material of the black matrix layer BM has on performance of the emission layer EML may be reduced. Thus, selection of the material of the black matrix layer BM may be made more freely, e.g., without concern for any effects of the material of the black matrix layer BM on the emission layer EML. In an implementation, the black matrix layer BM may include a suitable material that absorbs at least a portion of light. In an implementation, the black matrix layer BM may include, e.g., carbon black, graphite, a chromium-based material, dye, a metallic reflection layer, and/or an optical absorption layer.

A light shading rate of the closed area CDA in the black matrix layer BM may be equal to or greater than about 40%.

In an implementation, the light shading rate of the closed area CDA in the black matrix layer BM may be equal to or greater than about 40% and less than about 90%. In an implementation, the light shading rate of the closed area CDA in the black matrix layer BM may be equal to or greater than about 90%.

The black matrix layer BM may have a thickness equal to or less than several micrometers. For example, the black matrix layer BM may have a thickness less than 10 μm. The black matrix layer BM may be thinner than a polarizer film, which has a thickness of hundreds of micrometers, and the black matrix layer BM may be advantageous in making apparatuses thin and may be easily applied to flexible apparatuses. Also, the black matrix layer BM may be much more cost-effective than the polarizer film, and the black matrix layer BM may be economically advantageous as well.

Figure 4:
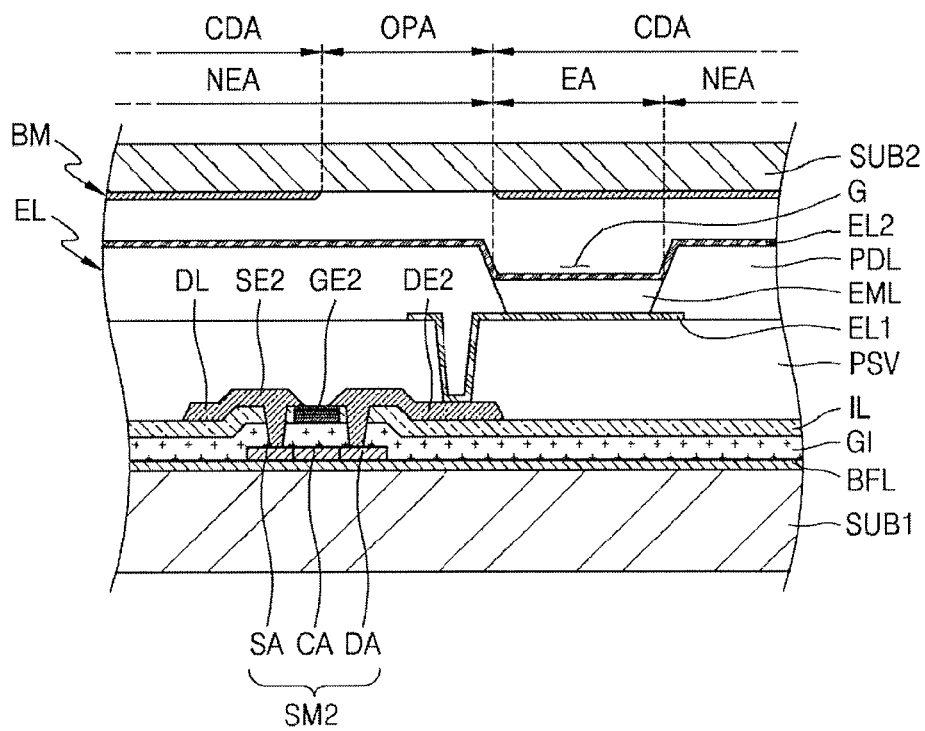
FIG. 4 illustrates a view of a comparative example in which a black matrix layer is misaligned in the organic light emitting display apparatus.

For the above-described improvement of contrast and luminous efficiency, the open area OPA of the black matrix layer BM may correspond to, overlie, or be aligned with the emitting area EA of the organic light emitting diode EL, and the closed area CDA of the black matrix layer BM may correspond to, overlie, or be aligned with the non-emitting area NEA of the organic light emitting diode EL. If the closed area CDA of the black matrix layer BM were to be disposed in or cover the emitting area EA of the organic light emitting diode EL, e.g., as illustrated in FIG. 4, the closed area CDA may prevent the transmission of light emitted from the emitting area EA of the organic light emitting diode EL, thereby lowering the luminous efficiency of the organic light emitting display apparatus.

In consideration of the above, in order to help align the black matrix layer BM, e.g., the open area OPA and the closed area CDA, exactly with the corresponding areas of organic light emitting diode EL, the organic light emitting display apparatus according to the present embodiment may further include a photoresist member 100. For example, at least a portion of the photoresist member 100 may be formed in or on the open area OPA of the black matrix layer BM. The photoresist member 100 may protrude toward the organic light emitting diode EL.

Figure 5:
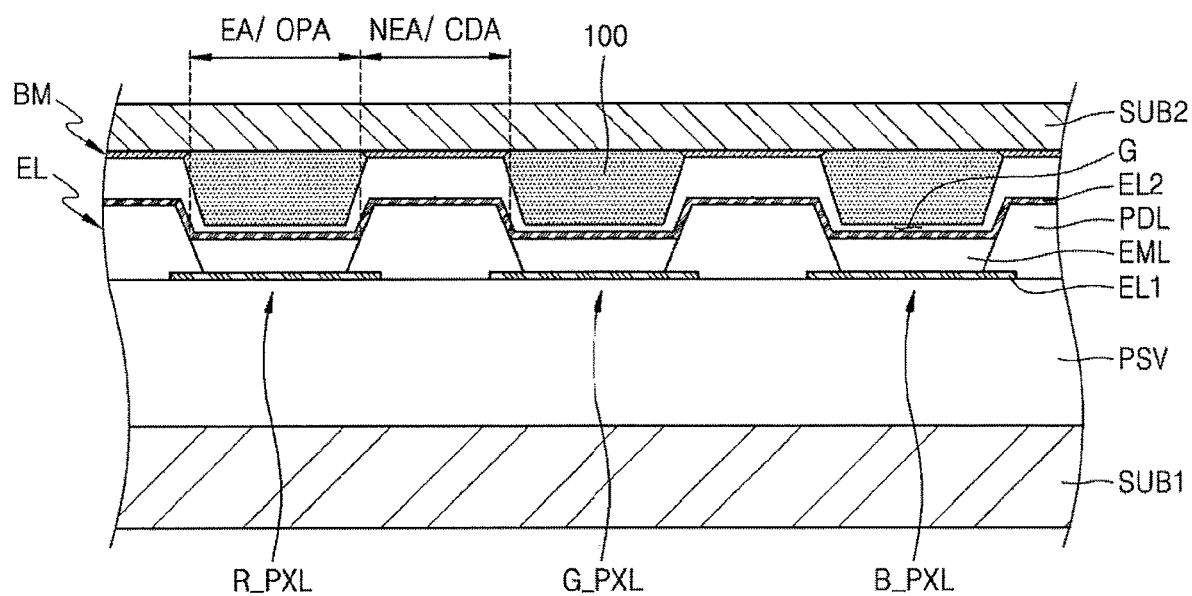
FIG. 5 illustrates a cross-sectional view of the organic light emitting display apparatus according to the present embodiment, in which three pixels adjacent to each other are shown.

FIG. 5 illustrates a cross-sectional view of the organic light emitting display apparatus according to the present embodiment, in which three adjacent pixels are illustrated. Referring to FIG. 5, hereinafter, the photoresist member 100 will be described in more detail.

In FIG. 5, for convenience of explanation, components between the first substrate SUB1 and the passivation layer PSV, e.g., the thin film transistors and some of the insulating layers, may be omitted.

Referring to FIG. 5, the organic light emitting diode EL may include a red pixel R_PXL, a green pixel G_PXL, and a blue pixel B_PXL. Although not illustrated in FIG. 5, in an implementation, a red color filter may be provided in the red pixel R_PXL, a green color filter may be provided in the green pixel G_PXL, and a blue color filter may be provided in the blue pixel B_PXL.

The organic light emitting diode EL may include the emitting area EA (including the emission layer EML), and the non-emitting area NEA (including the pixel defining layer PDL).

The photoresist member 100 may have at least a portion thereof inserted in the groove G (formed or defined by the emission layer EML and the pixel defining layer PDL) of the organic light emitting diode EL. By inserting at least a portion of the photoresist member 100 in the groove G, the location of the open area OPA of the black matrix layer BM may correspond to or be properly aligned with the emitting area EA of the organic light emitting diode EL. For example, using the photoresist member 100 may facilitate aligning the black matrix layer BM exactly with the organic light emitting diode EL. Thus, a decline in luminous efficiency of the organic light emitting display apparatus (which could otherwise occur when the black matrix layer BM is misaligned) may be prevented.

The photoresist member 100 may be prepared from a negative photosensitive material. The negative photosensitive material may have photocuring properties such that the photosensitive material hardens when irradiated with light. Thus, as the black matrix layer BM is used as a mask for forming the photoresist member 100, the photoresist member 100 may be formed in or on the open area OPA.

Transmissivity or transmittance of the photoresist member 100 may be equal to or greater than about 45%. Accordingly, when the organic light emitting display apparatus is of the top-emitting structure, the light generated in the emission layer EML may be emitted to the outside through the photoresist member 100 and the second substrate SUB2.

A concentration of impurities to be outgassed by the photoresist member 100 may be equal to or less than 100 ppm. For example, the impurities to be outgassed may include moisture (e.g., water) or oxygen. Thus, the photoresist member 100 may help prevent the organic light emitting diode EL from being exposed to moisture or oxygen.

The photoresist member 100 may further include, e.g., various functional particles or components. For example, the photoresist member 100 may further include at least one of a light scattering particle and an absorbent. As the light scattering particle, various materials for scattering light, e.g., titanium oxide or silica powder, may be used. As the absorbent, various materials for absorbing moisture, e.g., calcium oxide or zeolite, may be used. Thus, the photoresist member 100 may help improve light extraction efficiency and/or absorbing properties.

An example in which the photoresist member 100 is formed only in the open area OPA is illustrated in FIG. 5. In an implementation, the forming of the photoresist member 100 may vary so long as at least a portion of the photoresist member 100 is formed only in the open area OPA. For example, a photoresist member 100a or 100b (see FIGS. 6A and 6B) may be formed in the closed area CDA in addition to the open area OPA.

Figure 6A:
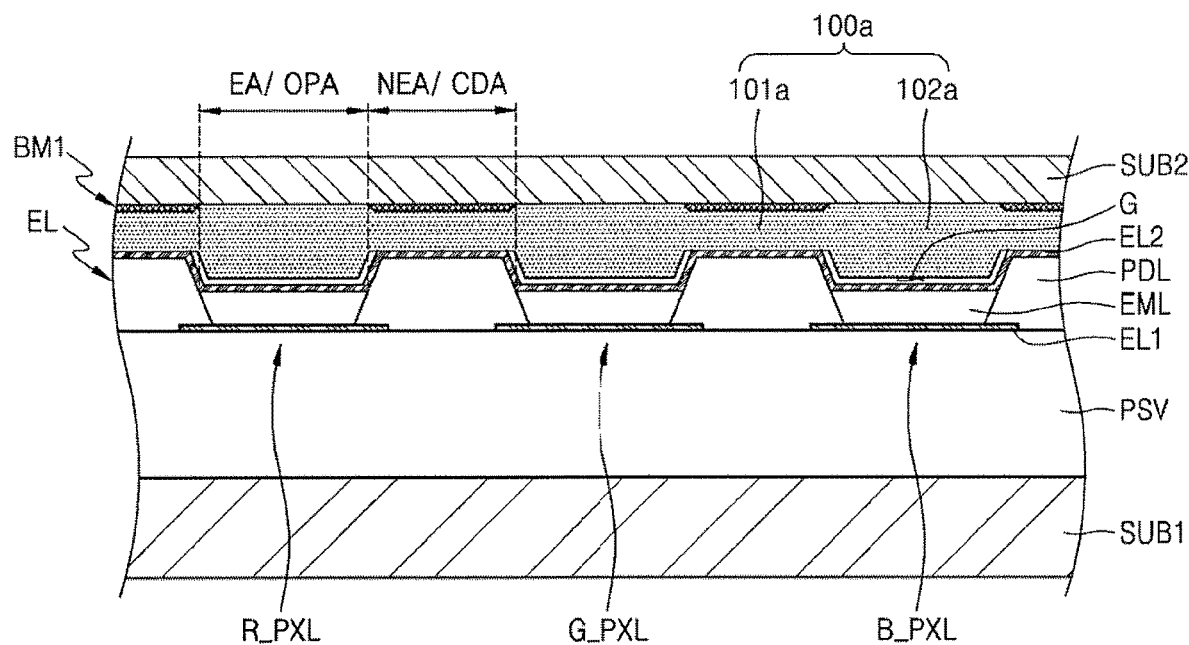
FIGS. 6A and 6B illustrate views of other embodiments of a photosensitive member, respectively.
Figure 6B:
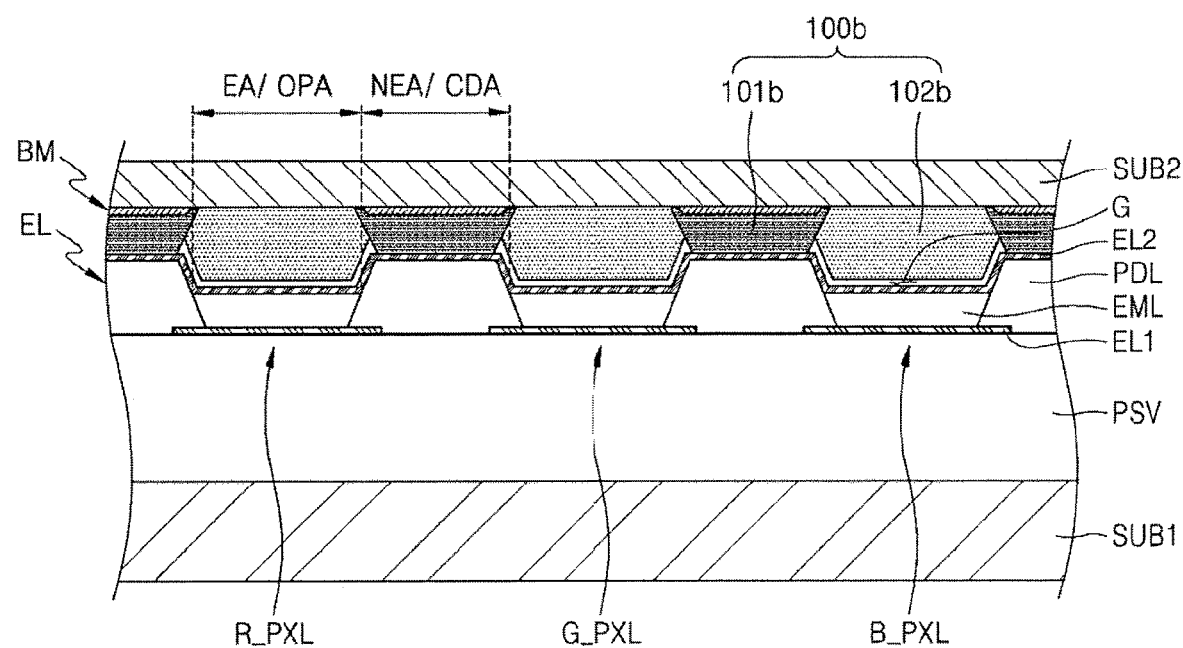

FIGS. 6A and 6B illustrate views of other embodiments of the photoresist member 100a and 100b, respectively. Referring to FIGS. 6A and 6B, the photoresist member 100a or 100b may include a first photoresist area 101a or 101b (formed in or aligned with the closed area CDA of the black matrix BM or BM1) and a second photoresist area 102a or 102b (formed in or aligned with the open area OPA of the black matrix BM or BM1). The second photoresist area 102a or 102b may protrude more or farther toward or into the organic light emitting diode EL or the first substrate SUB1 than the first photoresist area 101a or 101b.

Referring to FIG. 6A, in an implementation, materials of the first photoresist area 101a and the second photoresist area 102a may be identical. For example, the first photoresist area 101a and the second photoresist are 102a may both be prepared from negative photosensitive materials. In an implementation, the closed area CDA of a black matrix layer BM1 may transmit a portion of light. For example, a light shading rate of the black matrix layer BM1 may be equal to or greater than 40% and equal to or less than 90%. Likewise, light may also pass through a lower portion of the closed area CDA in the black matrix layer BM1, and the second photoresist area 102a may be formed in the lower portion of the closed area CDA.

Referring to FIG. 6B, in an implementation, materials of the first photoresist area 101b and the second photoresist area 102b may be different. For example, the first photoresist area 101b may be prepared from a positive photosensitive material and the second photoresist area 102b may be prepared from a negative photosensitive material. The positive photosensitive material may have photodegrading properties whereby the photosensitive material degrades when reacting with light. A light shading rate of the closed area CDA in a black matrix layer BM may be equal to or greater than 90%. Thus, by using the black matrix layer BM as a mask, the first photoresist area 101b (prepared from the positive photosensitive material) may be disposed in or on the closed area CDA through which light rarely passes) and the second photoresist area 102b (prepared from the negative photosensitive material) may be disposed in or on the open area OPA (through which light passes).

Referring to FIGS. 6A and 6B, the first photoresist area 101a or 101b may cover or be aligned with the closed area CDA of the black matrix layer BM1 or BM, and the first photoresist area 101a or 101b may help prevent gas generated in the black matrix layer BM1 or BM from reaching to the organic light emitting diode EL. Thus, the black matrix layer BM1 or BM may be formed of a material, e.g., an organic dye, that may generate relatively more gas. Accordingly, selection of the material of the black matrix layer BM1 or BM may be made more freely, without concern for any adverse effects. In an implementation, the first photoresist area 101a or 101b may be resistant to external shock, if an elastic material is included in the first photoresist area 101a or 101b. The elastic material may include, e.g., polyvinylidene fluoride (PVDF), styrene-butadiene rubber, or the like.

As described above with reference to FIG. 5, the second photoresist area 102a or 102b may be used for accurately aligning the black matrix layer BM1 or BM with the corresponding region (e.g., non-emitting area) of the organic light emitting diode EL.

In an implementation, the first photoresist area 101a or 101b and the second photoresist area 102a or 102b may further include various functional particles or components.

In an implementation, the first photoresist area 101a or 101b may further include at least one of a light blocking material, an absorbent, and/or a light scattering particle. As the light blocking material, various materials for blocking light, e.g., carbon black, chromium, and/or dye may be used. As the light scattering particle, various materials for scattering light, e.g., titanium oxide and/or silica powder, may be used. As the absorbent, various materials for absorbing moisture, e.g., calcium oxide and/or zeolite, may be used. Thus, the first photoresist area 101a or 101b may help further improve shading properties of the black matrix layer BM1 or BM, may absorb gas generated in the black matrix layer BM1 or BM, and/or may help improve light extraction efficiency.

In an implementation, the second photoresist area 102a or 102b may further include at least one of a light scattering particle and/or an absorbent. As the light scattering particle, various materials for scattering light, e.g., titanium oxide, may be used. As the absorbent, various materials for absorbing moisture, e.g., calcium oxide and/or zeolite, may be used. Thus, the second photoresist area 102a or 102b may help improve light extraction efficiency or absorbing properties.

FIGS. 7A through 7F schematically illustrate stages in a method of manufacturing the organic light emitting display apparatus of FIG. 2.

Figure 7A:
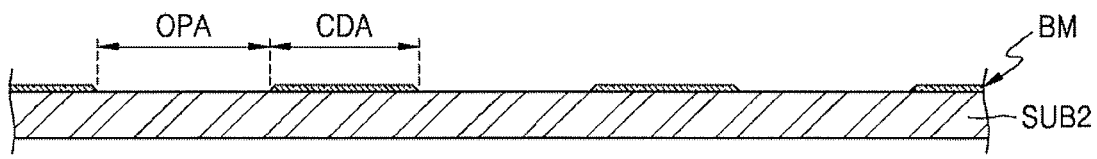
FIGS. 7A through 7F schematically illustrate stages in a method of manufacturing the organic light emitting display apparatus of FIG. 2.

Referring to FIG. 7A, a black matrix layer BM having an open area OPA and a closed area CDA may be formed at one surface of a second substrate SUB2.

The second substrate SUB2 may protect an organic light emitting diode EL and other thin films from external moisture or oxygen.

When the organic light emitting display apparatus is of a top-emitting structure, the second substrate SUB2 may be a transparent member that transmits light. For example, the second substrate SUB2 may be a glass substrate or may be a polymer substrate or a flexible film. In an implementation, the second substrate SUB2 may have a structure in which an organic film and an inorganic film are alternately stacked.

The the black matrix layer BM may transmit light generated in an emission layer EML through the open area OPA, and/or the black matrix layer BM may also absorb light coming in from the outside through the closed area CDA, thereby improving contrast and luminous efficiency of the organic light emitting display apparatus.

A light shading rate of the closed area CDA in the black matrix layer BM may be equal to or greater than about 90%. The black matrix layer BM may have a thickness equal to or less than several micrometers. For example, the black matrix layer BM may have a thickness less than about 10 μm.

Figure 7B:
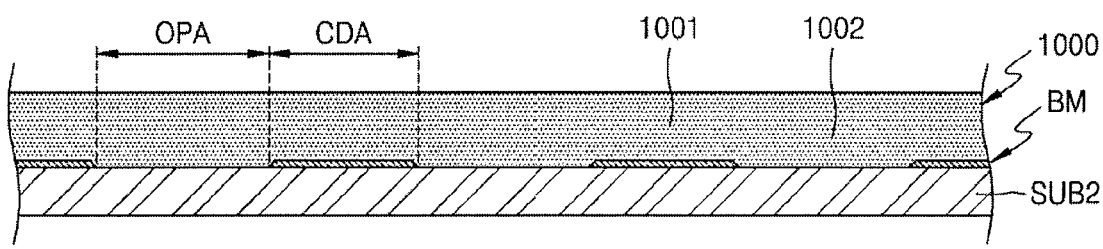

Referring to FIG. 7B, a photosensitive photoresist layer 1000 may be formed on the open area OPA and the closed area CDA of the black matrix layer BM.

The photosensitive photoresist layer 1000 may include a negative photosensitive material having photocuring properties such that the photosensitive material hardens when irradiated with light.

The photosensitive photoresist layer 1000 may further include various functional particles or components besides a photosensitive material. In an implementation, the photosensitive photoresist layer 1000 may further include at least one of a light scattering particle and an absorbent. As the light scattering particle, various materials for scattering light such as titanium oxide may be used. As the absorbent, various materials for absorbing moisture such as calcium oxide and zeolite may be used.

Figure 7C:
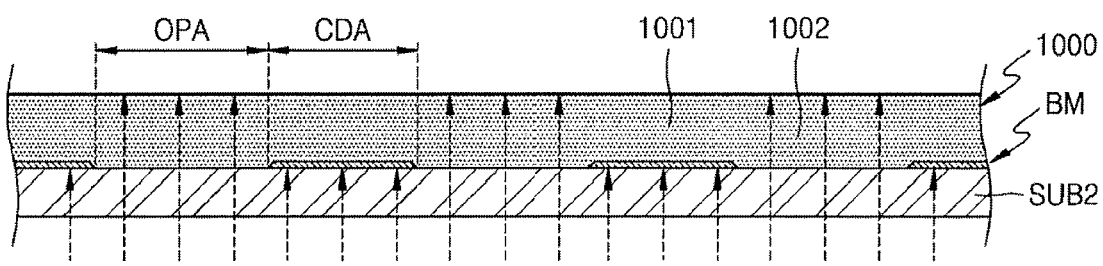
Figure 7D:
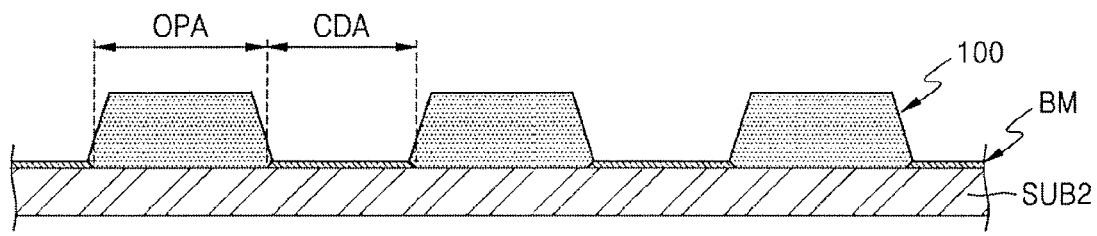

Referring to FIGS. 7C and 7D, after a light exposure process is performed by using the black matrix layer BM as a mask, a developing process may be performed.

The light shading rate of the black matrix layer BM may be equal to or greater than about 90%, and a portion 1001 of the photosensitive photoresist layer 1000 in or on the closed area CDA of the black matrix layer BM may hardly be exposed to light. On the other hand, a portion 1002 of the photosensitive photoresist layer 1000 in or on the open area OPA of the black matrix layer BM may be exposed to light. For example, the photosensitive photoresist layer 1000 may include the negative photosensitive material, and the portion 1001 of the photosensitive photoresist layer 1000 on the closed area CDA (and is hardly exposed to light) may be removed in the developing process. Thus, a photoresist member 100 (in the open area OPA and that has been exposed to light and developed) may remain.

Figure 7E:
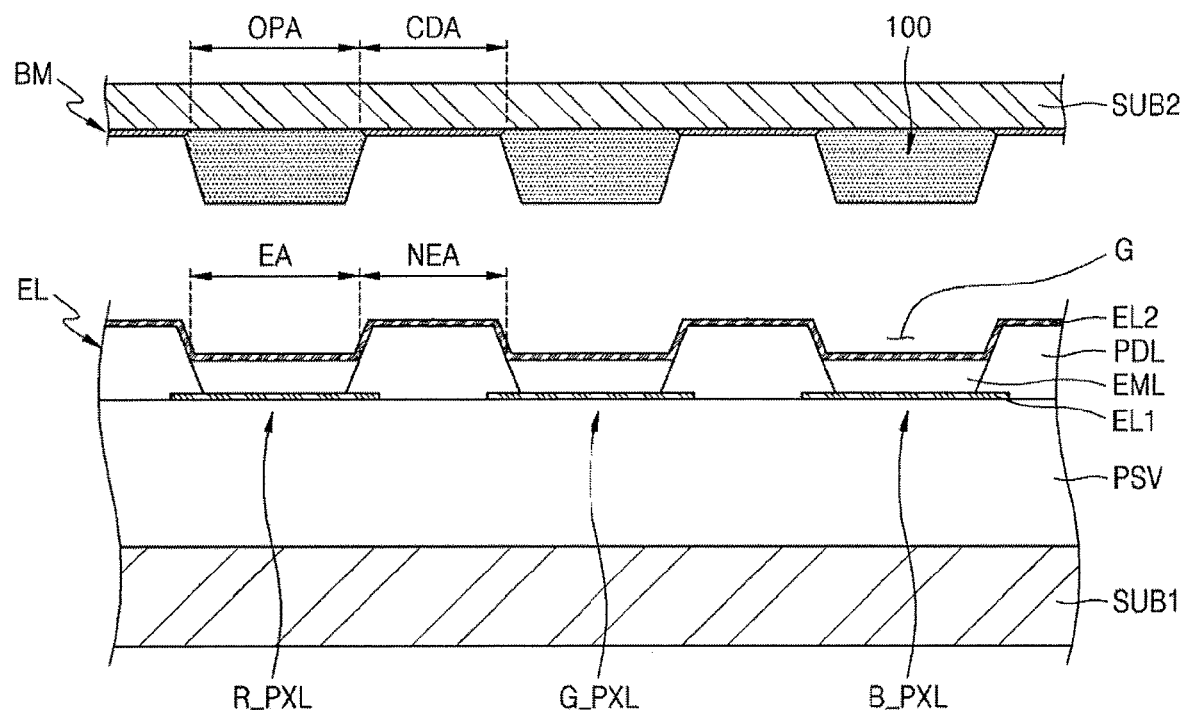

Referring to FIG. 7E, the second substrate SUB2 may be disposed to face a first substrate SUB1. The second substrate SUB2 may be disposed to face the first substrate SUB1 so that the photoresist member 100 of the second substrate SUB2 faces the emission layer EML and a pixel defining layer PDL in the first substrate SUB1. For example, a groove G in the organic light emitting diode EL may be formed or defined by the emission layer EML and the pixel defining layer PDL.

Figure 7F:
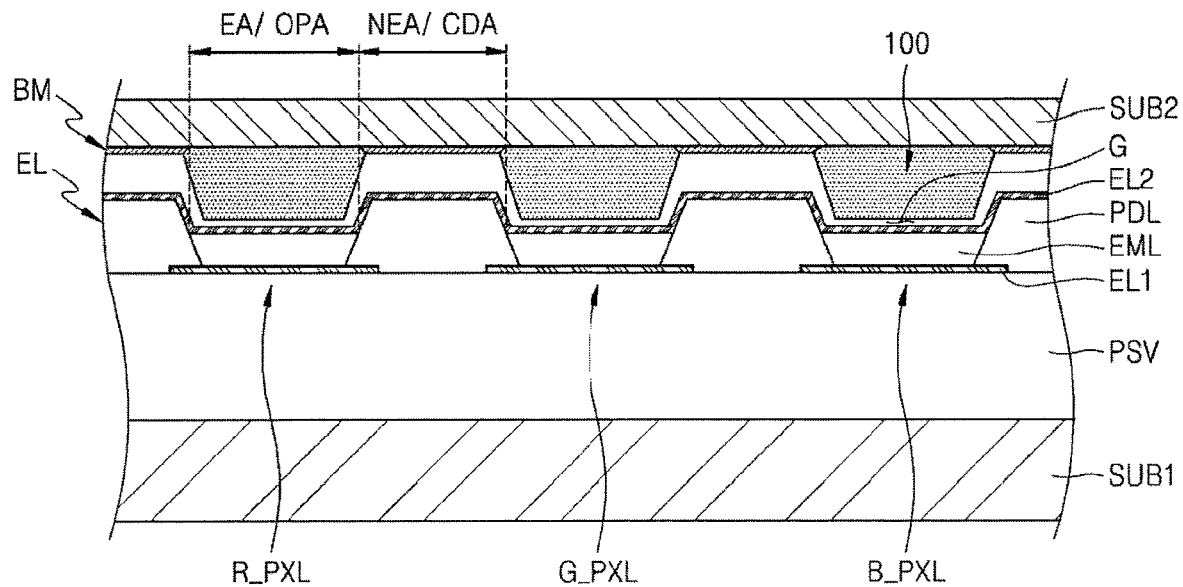

Referring to FIG. 7F, the second substrate SUB2 may be aligned with the first substrate SUB1 such that the open area OPA of the black matrix layer BM corresponds to, overlies, or is aligned with the emission layer EML.

During the alignment, at least a portion of the photoresist member 100 may be inserted in the groove G formed by the emission layer EML and the pixel defining layer PDL. For example, the photoresist member 100 may be in the open area OPA of the black matrix layer BM, and the black matrix layer BM may be exactly or precisely aligned on the organic light emitting diode EL by inserting the photoresist member 100 in the groove G such that the open area OPA corresponds to or overlies the emitting area EA of the organic light emitting diode EL. Thus, a decline in luminous efficiency of the organic light emitting display apparatus (which could otherwise occur when the black matrix layer BM is misaligned) may be prevented.

Although not illustrated in the diagram, bonding the first substrate SUB1 and the second substrate SUB2 may be performed by using a sealing member or the like.

FIGS. 8A through 8F schematically illustrate stages in a method of manufacturing an organic light emitting display apparatus of FIG. 6A.

Figure 8A:
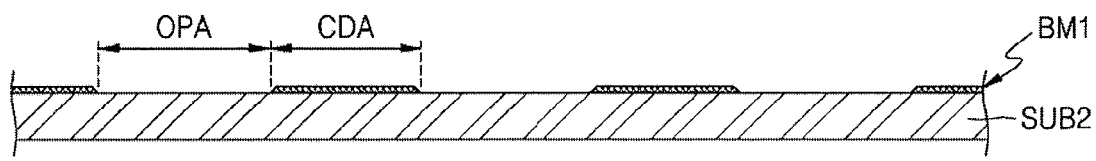
FIGS. 8A through 8F schematically illustrate stages in a method of manufacturing an organic light emitting display apparatus of FIG. 6A.

Referring to FIG. 8A, a black matrix layer BM1 having an open area OPA and a closed area CDA may be formed on one surface of a second substrate SUB2.

Unlike the black matrix layer BM of FIG. 7A, a light shading rate of the closed area CDA in the black matrix layer BM1 may be equal to or greater than about 40% and less than about 90%. Thus, the closed area CDA of the black matrix layer BM1 may transmit a portion of light in a light exposure process.

Figure 8B:
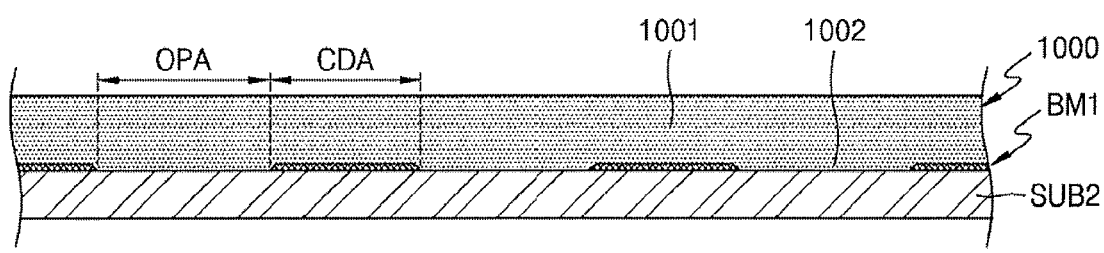

Referring to FIG. 8B, a photosensitive photoresist layer 1000 may be formed on the open area OPA and the closed area CDA of the black matrix layer BM1.

The photosensitive layer 1000 may include a negative photosensitive material having photocuring properties such that the photosensitive material hardens when irradiated with light.

The photosensitive photoresist layer 1000 may further include various functional particles or components besides a photosensitive material. In an implementation, the photosensitive photoresist layer 1000 may further include at least one of a light blocking material, an absorbent, and a light scattering particle. As the light blocking material, various materials for blocking light such as carbon black, chromium, and dye may be used. As the light scattering particle, various materials for scattering light such as titanium oxide may be used. As the absorbent, various materials for absorbing moisture such as calcium oxide and zeolite may be used.

Figure 8C:
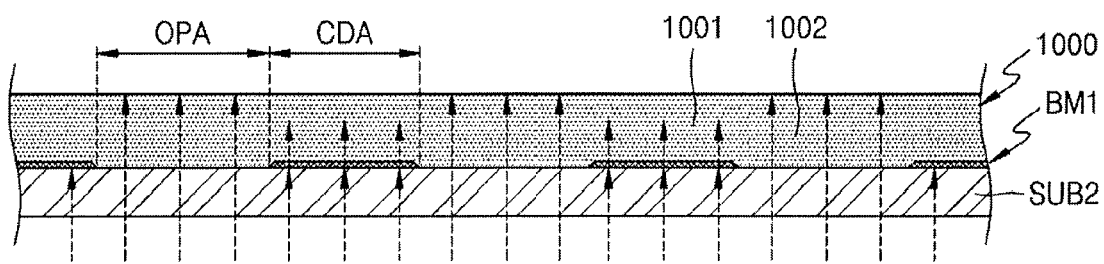
Figure 8D:
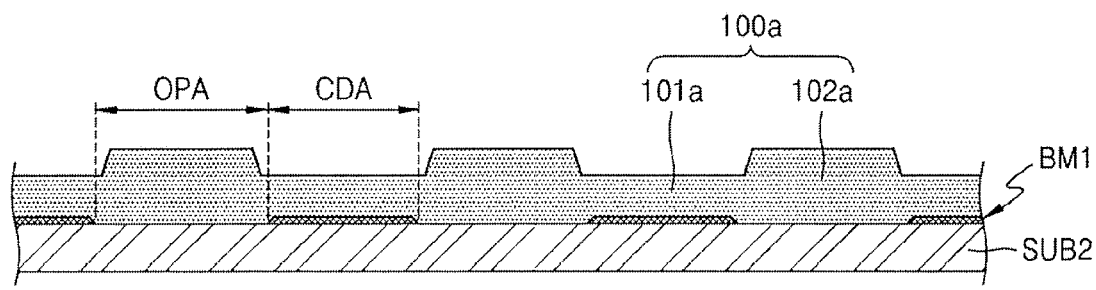

Referring to FIGS. 8C and 8D, after a light exposure process may be performed by using the black matrix layer BM1 as a mask, a developing process may be performed.

A portion 1002 of the photosensitive photoresist layer 1000 in or on the open area OPA of the black matrix layer BM1 may be exposed to light. Accordingly, the portion 1002 of the photosensitive photoresist layer 1000 on the open area OPA may harden.

The light shading rate of the closed area CDA in the black matrix layer BM1 may be equal to or greater than about 40% and less than about 90%, and a portion 1001 of the photosensitive photoresist layer 1000 in or on the closed area CDA of the black matrix layer BM1 may be exposed to light. However, the portion 1001 of the photosensitive photoresist layer 1000 in or on the closed area CDA may be exposed to less light than the portion 1002 of the photosensitive photoresist layer 1000 in or on the open area OPA of the black matrix layer BM1. Accordingly, a region of the portion 1001 of the photosensitive photoresist layer 1000 in a lower part of the closed area CDA may harden adjacent to the black matrix layer BM1.

In the developing process, the portion 1002 of the photosensitive photoresist layer 1000 in or on the open area OPA and a part of the portion 1001 of the photosensitive photoresist layer 1000 in or on the closed area CDA may remain. Accordingly, a photoresist member 100a may include a first photoresist area 101a (in or on the closed area CDA) and a second photoresist area 102a (in or on the open area OPA). Here, the second photoresist area 102a may have been exposed to more light than the first photoresist area 101a, and the second photoresist area 102a may be thicker than the first photoresist area 101a. The second photoresist area 102a may protrude toward an organic light emitting diode EL more than the first photoresist area 101a. For example, the second photoresist area 102a may protrude further into the organic light emitting diode EL than the first photoresist area 101a. For example, a distance between the second photoresist area 102a and the first substrate SUB1 may be less than a distance between the first photoresist area 101a and the first substrate SUB1.

Figure 8E:
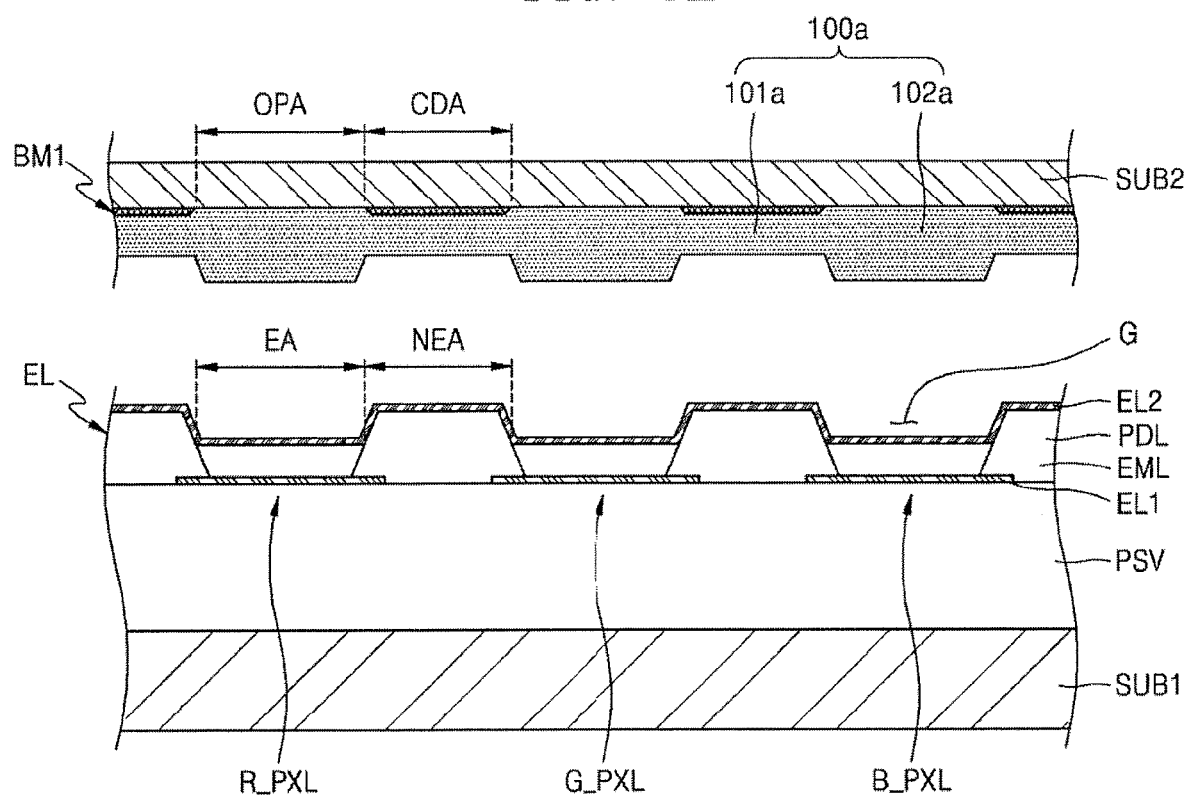

Referring to FIG. 8E, the second substrate SUB2 may be disposed to face the first substrate SUB1. The second substrate SUB2 may be disposed to face the first substrate SUB1 so that the photoresist member 100a of the second substrate SUB2 faces an emission layer EML and a pixel defining layer PDL on the first substrate SUB1. A groove G in the organic light emitting diode EL may be formed or defined by the emission layer EML and the pixel defining layer PDL.

Figure 8F:
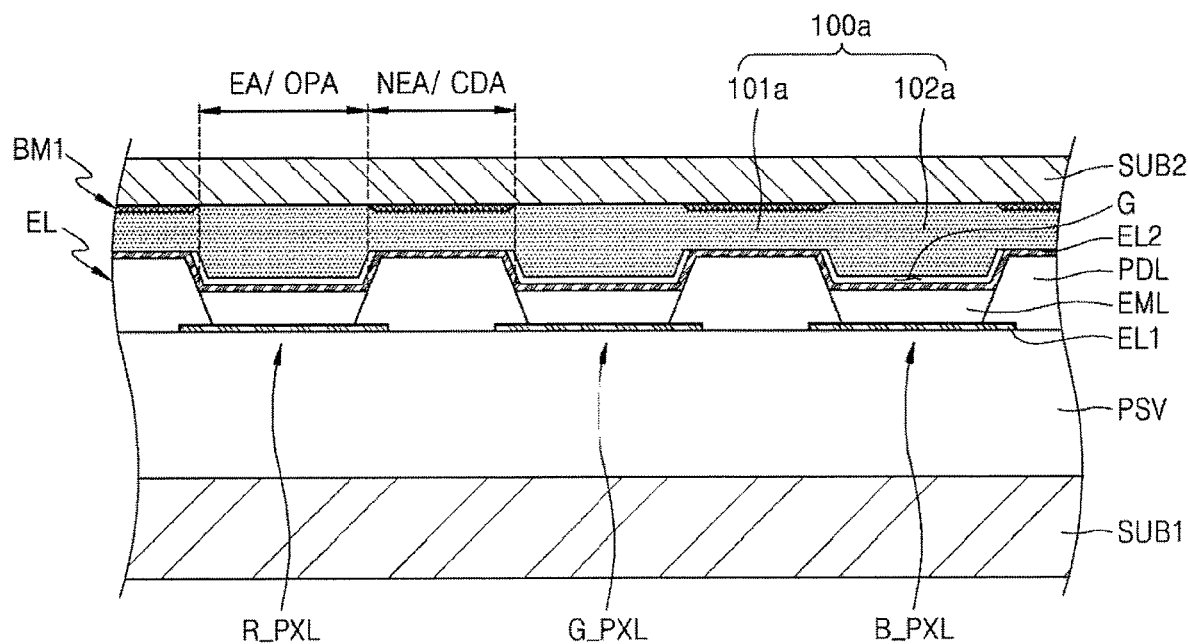

Referring to FIG. 8F, the second substrate SUB2 may be aligned with the first substrate SUB1 such that the open area OPA of the black matrix layer BM1 corresponds to, is aligned with, or overlies the emission layer EML.

For the alignment, at least a portion of the second photoresist area 102a may be inserted in the groove G in the organic light emitting diode formed or defined by the emission layer EML and the pixel defining layer PDL. The second photoresist area 102a may be formed in or on the open area OPA of the black matrix layer BM1, and the black matrix layer BM1 may be exactly or precisely aligned with the organic light emitting diode EL by inserting the second photoresist area 102a in the groove G such that the open area OPA corresponds to, overlies, or is aligned with an emitting area EA of the organic light emitting diode EL. Thus, a decline in luminous efficiency of the organic light emitting display apparatus (which could otherwise occur when the black matrix layer BM1 is misaligned) may be prevented.

The photoresist member 100a may cover the closed area CDA of the black matrix layer BM1, and the photoresist member 100a may help prevent moisture or gas generated in the black matrix layer BM1 from reaching the organic light emitting diode EL. If the photoresist member 100a further includes an absorbent, the effect of blocking gas may be further improved.

FIGS. 9A through 9I schematically illustrate stages in a method of manufacturing an organic light emitting display apparatus of FIG. 6B. While the method of manufacturing the organic light emitting display apparatus according to the present embodiment is substantially similar to the method of manufacturing the organic light emitting display apparatus presented in FIGS. 7A through 7F, there is a difference that before a photosensitive photoresist layer 1000 is formed, a second photosensitive photoresist layer 2000 may be formed of a material that is different from that of the photosensitive layer 1000. Hereinafter, repeated description of similarities may be omitted and differences will be mainly described.

Figure 9A:
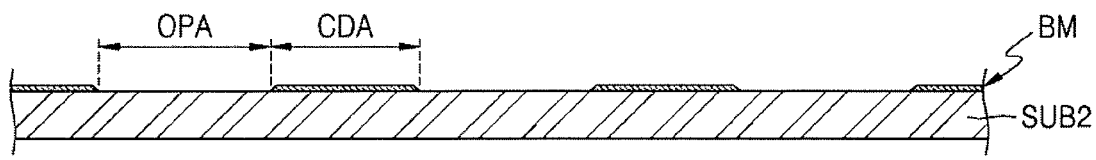
FIGS. 9A through 9I schematically illustrate stages in a method of manufacturing an organic light emitting display apparatus of FIG. 6B.
Figure 9B:
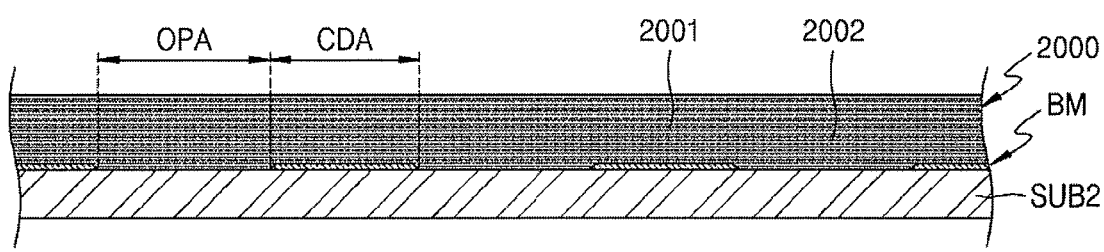

Referring to FIG. 9B, the second photosensitive photoresist layer 2000 may be formed in or on an open area OPA and a closed area CDA of a black matrix layer BM. The second photosensitive photoresist layer 2000 may include a positive photosensitive material having photodegrading properties such that the photosensitive material degrades when reacting with light.

Figure 9C:
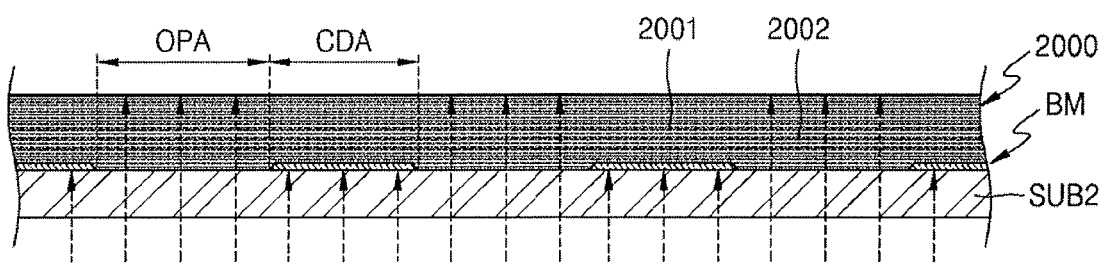
Figure 9D:
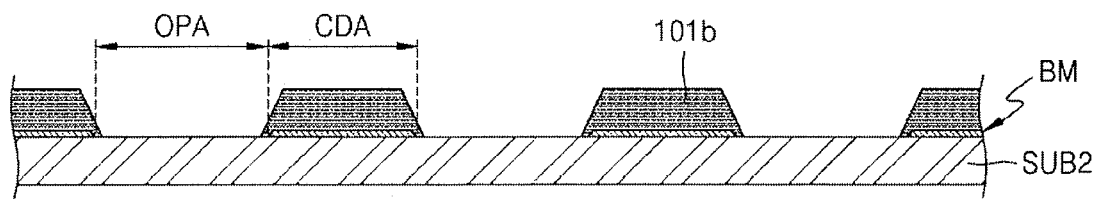
Figure 9E:
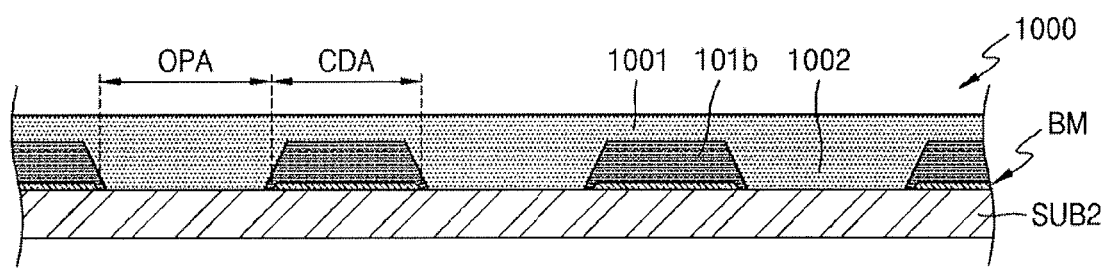
Figure 9F:
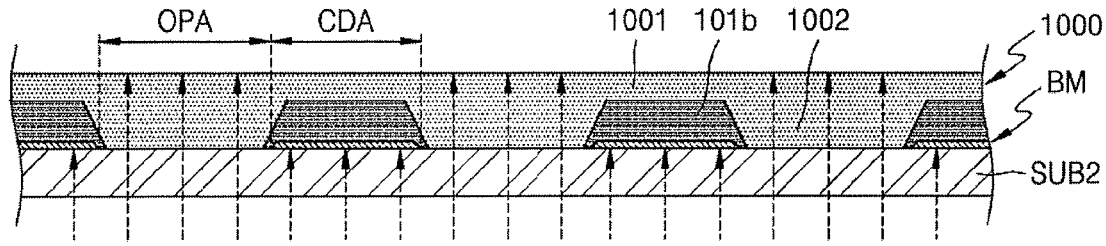
Figure 9G:
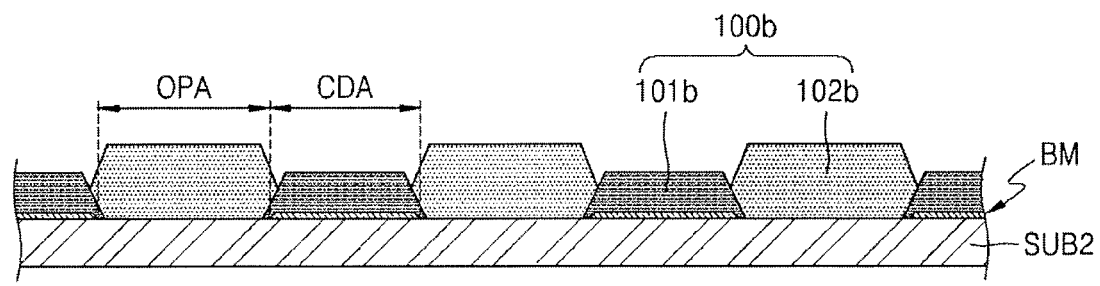
Figure 9H:
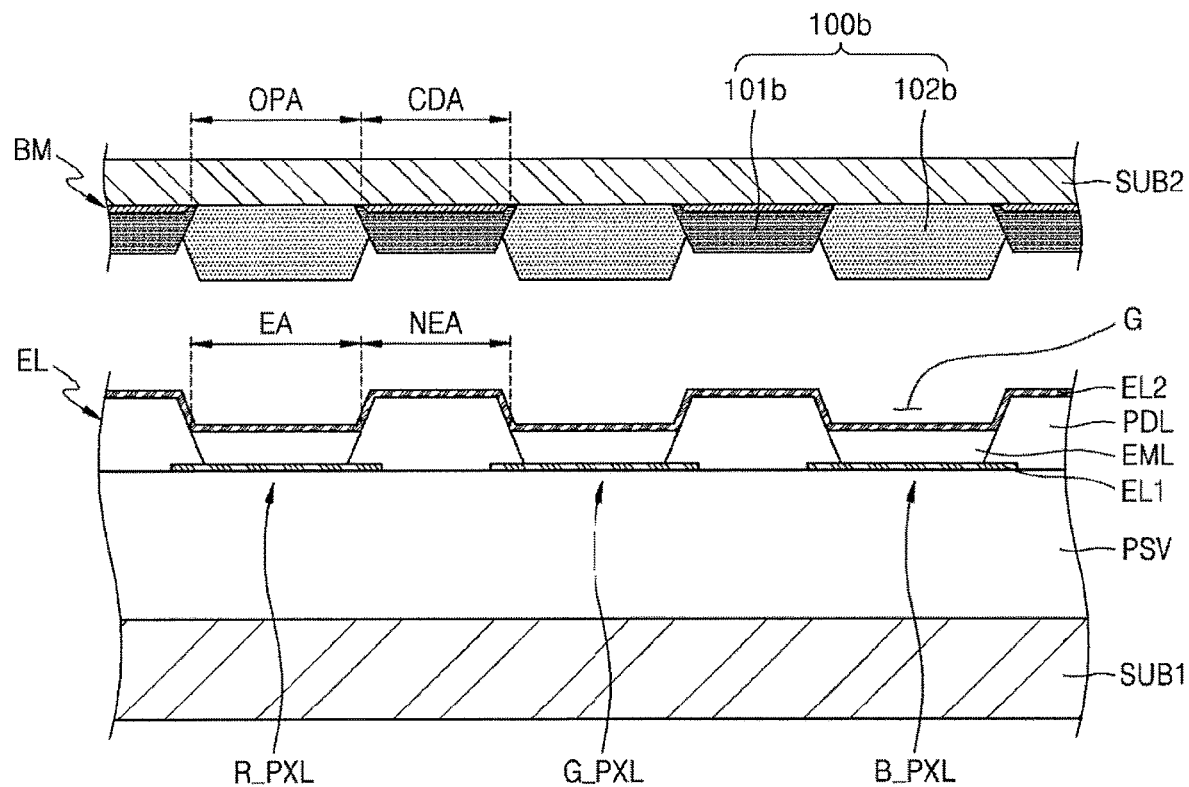
Figure 9I:
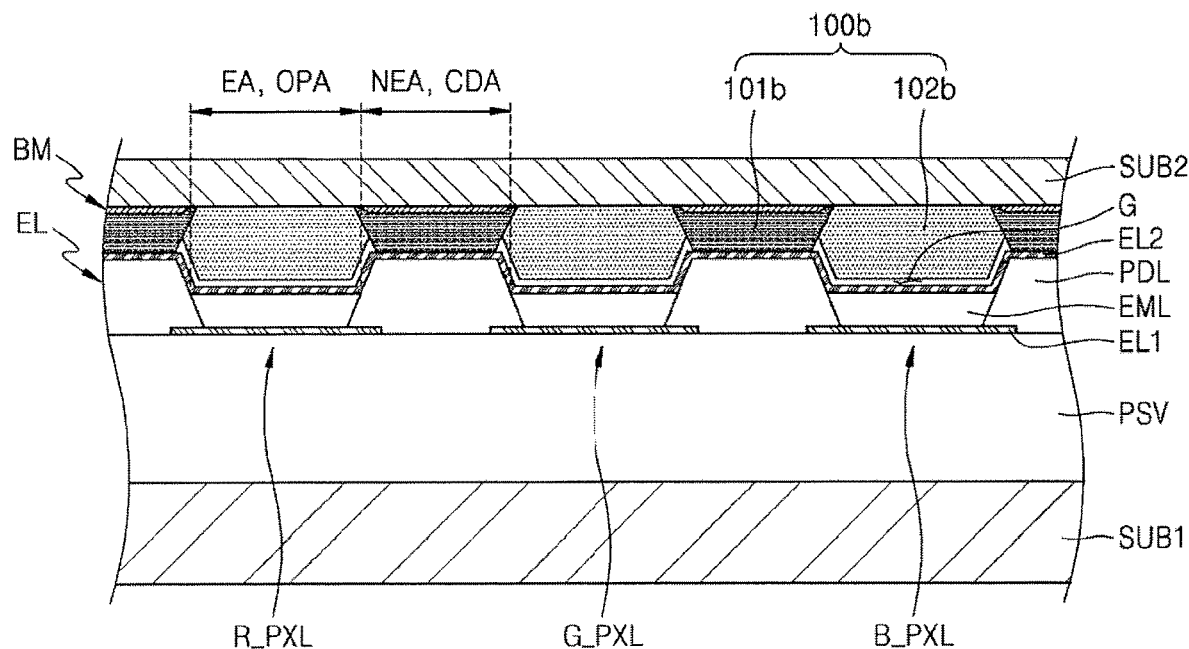

Referring to FIGS. 9C and 9D, after a light exposure process is performed by using the black matrix layer BM as a mask, a developing process may be performed.

A light shading rate of the black matrix layer BM may be equal to or greater than about 90%, and a portion 2001 of the second photosensitive photoresist layer 2000 in or on the closed area CDA of the black matrix layer BM may hardly be exposed to light. The second photosensitive photoresist layer 2000 may include the positive photosensitive material, and a portion 2002 of the second photosensitive photoresist layer 2000 in or on the open area OPA may be exposed to light and removed in the developing process. Thus, the portion 2001 of the second photosensitive photoresist layer 2000 that is in or on the closed area CDA and is hardly exposed to light may remain. The portion 2001 of the second photosensitive photoresist layer 2000 that remains may then be defined as a first photosensitive area 101b.

The second photosensitive photoresist layer 2000 may further include various functional particles or components. In an implementation, the second photosensitive photoresist layer 2000 may further include at least one of a light blocking material, an absorbent, and a light scattering particle. As the light blocking material, various materials for blocking light such as carbon black, chromium, and dye may be used. As the light scattering particle, various materials for scattering light such as titanium oxide may be used. As the absorbent, various materials for absorbing moisture such as calcium oxide and zeolite may be used. Thus, the first photoresist area 101b may help further improve shading properties of the black matrix layer BM, may absorb gas generated in the black matrix layer BM, and/or may help improve light extraction efficiency.

A manufacturing process corresponding to FIGS. 9E through 9I, except that the first photoresist area 101b is disposed in the closed area CDA, may be performed in a manner similar to that corresponding to FIGS. 7B through 7F.

Thus, the black matrix layer BM may be exactly or precisely aligned with an organic light emitting diode EL by inserting a second photoresist area 102b of a photoresist member 100b in a groove G such that the open area OPA corresponds to or is aligned with an emitting area EA of the organic light emitting diode EL.

In an implementation, when the first photoresist area 101b contacts a pixel defining layer PDL, the first photoresist area 101b may perform a function of absorbing shock. For example, the second photosensitive photoresist layer 2000 may further include an elastic material.

As described above, according to one or more of the above embodiments, an organic light emitting display apparatus and a method of manufacturing the same are disclosed in which a black matrix layer may be used for improving contrast and may be used as a mask in the manufacture of the organic light emitting display apparatus to form a photoresist member in or on an open area of the black matrix layer, thereby exactly or precisely aligning the black matrix layer with an organic light emitting diode. Thus, an undesirable decrease luminous efficiency of the organic light emitting display apparatus may be prevented.

The embodiments may provide an organic light emitting display apparatus having easily improved contrast and luminous efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light emitting display apparatus, the method comprising:
    forming a black matrix layer on one surface of a second substrate such that the black matrix layer includes an open area and a closed area;
    forming a photosensitive photoresist layer in the open area and the closed area of the black matrix layer;
    light exposing and developing the photosensitive photoresist layer such that a photoresist member remains in the open area of the black matrix layer;
    providing a first substrate that has an emission layer and a pixel defining layer thereon;
    disposing the second substrate on the first substrate such that the second substrate faces the first substrate; and
    aligning the second substrate with the first substrate such that the open area of the black matrix layer is aligned with the emission layer, by inserting at least a portion of the photoresist member in a groove formed by the emission layer and the pixel defining layer.

2. The method as claimed in claim 1, wherein the photosensitive photoresist layer includes a negative photosensitive material.

3. The method as claimed in claim 1, wherein the closed area of the black matrix layer has a light shading rate equal to or greater than about 40%.

4. The method as claimed in claim 1, wherein the photoresist member includes:
    a first photoresist area on the closed area, and
    a second photoresist area on the open area, the second photoresist area being thicker than the first photoresist area.

5. The method as claimed in claim 4, wherein a material of the first photoresist area and that of the second photoresist area are identical.

6. The method as claimed in claim 5, wherein the first photoresist area and the second photoresist area are prepared from negative photosensitive materials.

7. The method as claimed in claim 1, further comprising:
    forming a second photosensitive photoresist layer, and
    light exposing and developing the second photosensitive photoresist layer such that a second photoresist member remains on the closed area of the black matrix layer.

8. The method as claimed in claim 7, wherein the forming the second photosensitive photoresist layer and the light exposing and developing are performed prior to forming the photosensitive photoresist layer.

9. The method as claimed in claim 7, wherein a material of the photosensitive photoresist layer and that of the second photosensitive photoresist layer are different from each other.

10. The method as claimed in claim 7, wherein the photosensitive photoresist layer is prepared from a negative photosensitive material, and
    the second photosensitive photoresist layer is prepared from a positive photosensitive material.

* * * * *